(12) United States Patent
Sulyman et al.

(10) Patent No.: US 12,020,977 B2
(45) Date of Patent: Jun. 25, 2024

(54) LIFT PIN ASSEMBLY

(71) Applicant: Applied Materials, Inc., Santa Clara, CA (US)

(72) Inventors: Alexander Sulyman, San Francisco, CA (US); Anwar Husain, Pleasonton, CA (US); Timothy Joseph Franklin, Campbell, CA (US); Carlaton Wong, Sunnyvale, CA (US); Xue Yang Chang, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 240 days.

(21) Appl. No.: 17/688,705

(22) Filed: Mar. 7, 2022

(65) Prior Publication Data

US 2022/0293451 A1 Sep. 15, 2022

Related U.S. Application Data

(60) Provisional application No. 63/160,722, filed on Mar. 12, 2021.

(51) Int. Cl.
*H01L 21/687* (2006.01)
*H01L 21/683* (2006.01)

(52) U.S. Cl.
CPC .... *H01L 21/68742* (2013.01); *H01L 21/6833* (2013.01); *H01L 21/68785* (2013.01)

(58) Field of Classification Search
CPC ..... H01J 2237/2007; H01J 2237/20235; H01J 2237/334; H01J 37/32449;
(Continued)

(56) References Cited

U.S. PATENT DOCUMENTS

2002/0011204 A1* 1/2002 Gujer ................. C23C 16/4586
118/500
2006/0156981 A1 7/2006 Fondurulia et al.
(Continued)

FOREIGN PATENT DOCUMENTS

WO WO2021168025 A1 8/2021

OTHER PUBLICATIONS

International Search Report and Written Opinion for PCT/US2022/019253 dated Jun. 28, 2022.

*Primary Examiner* — Jared Fureman
*Assistant Examiner* — Nicolas Bellido
(74) *Attorney, Agent, or Firm* — MOSER TABOA (57) ABSTRACT

Methods and apparatus for lift pin assemblies for substrate processing chambers are provided. In some embodiments, a lift pin assembly includes a lift pin comprising a shaft, a head, and a coupling end, the head configured to rest against an electrostatic chuck; an upper guide comprising a top end, a bottom end, and a first opening extending from the top end to the bottom end, wherein the shaft is disposed and axially movable through the first opening; a lower guide comprising a top end, a bottom end, and a second opening and a third opening extending from the top end to the bottom end, wherein the third opening is larger than the second opening, and wherein the shaft is disposed and axially movable through the second opening and the third opening; and a biasing mechanism coupled to the shaft and configured to bias the lift pin against the electrostatic chuck.

20 Claims, 6 Drawing Sheets

(58) Field of Classification Search
CPC ......... H01J 37/32715; H01L 21/67017; H01L 21/67069; H01L 21/67103; H01L 21/67109; H01L 21/6831; H01L 21/6833; H01L 21/68742; H01L 21/68757; H01L 21/68785

See application file for complete search history.

(56) References Cited

U.S. PATENT DOCUMENTS

| | | |
|---|---|---|
| 2014/0265097 A1 | 9/2014 | Cuvalci et al. |
| 2017/0032997 A1* | 2/2017 | Willwerth ........... H01L 21/6875 |
| 2018/0114716 A1 | 4/2018 | Hao et al. |
| 2018/0158711 A1 | 6/2018 | Sasaki et al. |
| 2019/0027394 A1* | 1/2019 | Sarode Vishwanath ..................... H01L 21/68757 |
| 2019/0035671 A1* | 1/2019 | Ha .................... H01L 21/68757 |
| 2021/0005504 A1 | 1/2021 | Han et al. |
| 2022/0293452 A1* | 9/2022 | Sulyman ........... H01J 37/32715 |

* cited by examiner

LIFT PIN ASSEMBLY

CROSS-REFERENCE TO RELATED APPLICATIONS

This application claims benefit of U.S. provisional patent application Ser. No. 63/160,722, filed Mar. 12, 2021, which is herein incorporated by reference in its entirety.

FIELD

Embodiments of the present disclosure generally relate to semiconductor processing equipment, and more specifically, to lift pin assembly for use in semiconductor processing systems.

BACKGROUND

Semiconductor processing systems, such as plasma processing chambers include substrate supports having electrostatic chucks for supporting substrates during processing of such substrates. Lift pin holes are formed through the electrostatic chuck accommodate lift pins that raise and/or lower substrates onto a support surface of the electrostatic chuck.

In plasma processing chambers, the electrostatic chuck is subjected to high-power radio frequency (RF) fields and high-density plasmas in the vicinity of the substrate. The inventors have observed that, in such plasma processing chambers, arcing can occur in and through lift pin holes damaging the substrate support components.

Accordingly, the inventors have provided embodiments of improved lift pin assemblies.

SUMMARY

Methods and apparatus for lift pin assemblies for substrate processing chambers is provided herein. In some embodiments, a lift pin assembly includes a lift pin comprising an elongate shaft, a head at the top of the shaft, and a coupling end at the bottom of the shaft, the head configured to rest against an electrostatic chuck; an upper guide comprising a top end, a bottom end, and a first opening extending from the top end to the bottom end, wherein the shaft is disposed through and axially movable through the first opening; a lower guide comprising a top end, a bottom end, a second opening and a third opening extending from the top end to the bottom end, wherein the third opening is larger than the second opening, and wherein the shaft is disposed through and can freely axially move through the second opening and the third opening; and a biasing mechanism coupled to the shaft and configured to bias the lift pin against the electrostatic chuck in a downward direction from the head of the lift pin to the coupling end of the lift pin.

In some embodiments, a substrate support includes: an electrostatic chuck having a surface configured to support a substrate and having a plurality of lift holes; a base plate beneath the electrostatic chuck; and a plurality of lift pin assemblies disposed within the base plate, and configured to allow a corresponding plurality of lift pins to pass through the corresponding lift pin holes of the electrostatic chuck, wherein the plurality of lift pin assemblies are as described in any of the embodiments disclosed herein; and a lift plate disposed within the base plate and configured to selectively provide a force against a bottom of the lift pins sufficient to overcome the biasing force and raise the heads of the lift pins above the surface of the electrostatic chuck.

In some embodiments, a substrate support includes: an electrostatic chuck having a surface configured to support a substrate and having a plurality of lift pin holes; a first plate and a second plate beneath the electrostatic chuck, the first plate configured for coupling to an RF power source; a base plate beneath the first plate and the second plate; a plurality of lift pin assemblies disposed within the base plate, the first plate, and the second plate, and configured to allow a corresponding plurality of lift pins to pass through corresponding lift pin holes of the electrostatic chuck, wherein the plurality of lift pin assemblies are as described in any of the embodiments described herein; and a lift plate disposed within the base plate and configured to selectively provide a force against a bottom of the lift pins sufficient to overcome the biasing force and raise the heads of the lift pins above the surface of the electrostatic chuck.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

To facilitate understanding, identical reference numerals have been used, where possible, to designate identical elements that are common to the figures. The Figures are not drawn to scale and may be simplified for clarity. Elements and features of one embodiment may be beneficially incorporated in other embodiments without further recitation.

DETAILED DESCRIPTION

Embodiments of lift pin assemblies, substrate supports incorporating such lift pin assemblies, and substrate processing chambers incorporating such lift pin assemblies are provided herein. Embodiments described herein utilize geometry of a head of a lift pin, which enhances pressure control within the processing chamber, gap control between the head of the lift pin and a substrate support of the substrate processing chamber, and blocks line of sight of a plasma to a conductive pathway to reduce lift pin arcing or plasma light up. The lift pin is guided using materials having a low dielectric constant, which reduces the electric field in the assembly. A biasing mechanism, such as a spring, additional weight, magnets, or a hoop or lift plate is used to bias the lift pin towards the electrostatic chuck for return after being lifted and for increasing the contact between the head of the lift pin and the substrate support.

Figure 1:
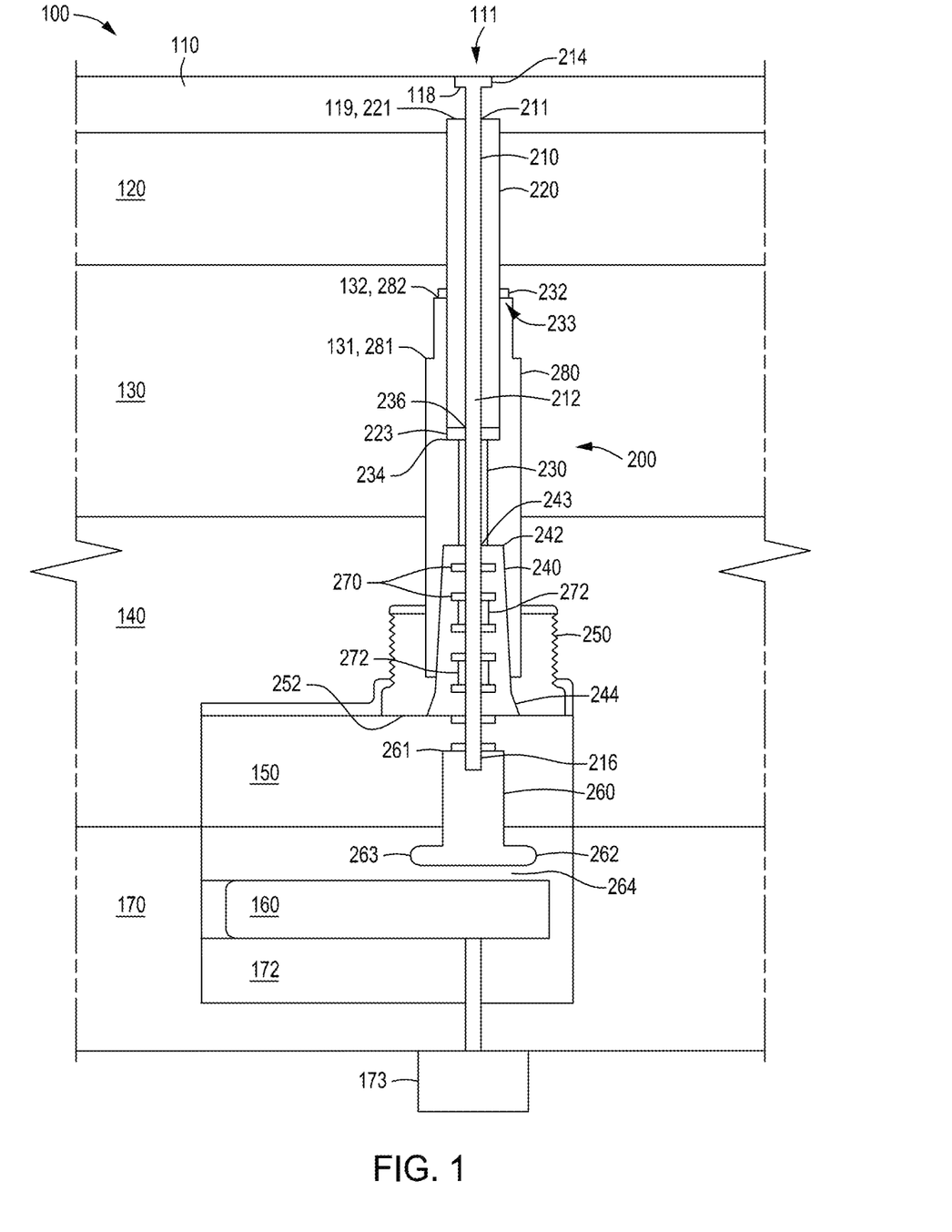
FIG. 1 is a partial cross section view of a substrate support of a processing chamber, the substrate support including a lift pin assembly, in accordance with at least some embodiments of the present disclosure.

FIG. 1 is a partial cross section view of a substrate support 100 of a processing chamber, the substrate support including a lift pin assembly 200, in accordance with at least some embodiments of the present disclosure. In some embodiments, the plasma processing chamber is an etch processing chamber, and comprises a substrate support, which may be for example, an electrostatic chuck, such as a Coulombic or a J-R chuck. However, other types of substrate supports and other types of processing chambers configured for different processes can also use or be modified for use with embodiments of the lift pin assemblies described herein. Suitable plasma processing chambers that may be adapted for use with the teachings disclosed herein are available from Applied Materials, Inc. of Santa Clara, CA Other processing chambers may be adapted to benefit from one or more of the methods of the present disclosure.

In some embodiments, the substrate support 100 comprises an electrostatic chuck 110, a first plate 120, a second plate 130, a third plate 140 and a base plate 170. Other configurations of substrate supports can have different configurations including different numbers of plates and/or materials comprising the plates. In some embodiments, the first plate 120 is an aluminum plate, the second plate 130 is a polyphenylene sulfide (PPS) plate or other insulator material, the third plate 140 is an aluminum plate, and the base plate 170 may comprise any metal or non-metal plate. In some embodiments, the first plate 120 is coupled to a power source, such as an RF power source, and the third plate 140 is connected to ground, so that, in operation, the first plate 120 may be RF hot, and the third plate 140 may be at ground potential.

The lift pin assembly 200 is disposed in the substrate support 100 and is configured to selectively raise or lower a lift pin to raise or lower a substrate with respect to the substrate support 100. For example, in some embodiments and as described in FIG. 1, the lift pin assembly 200 is disposed in the substrate support 100 and extends through the electrostatic chuck 110 and the plates 120, 130, 140, and into the base plate 170. The lift pin assembly 200 includes a lift pin 210 having an elongate shaft 212, a head 214 at the top of the shaft 212, and a coupling end 216 at the bottom of the shaft 212. The shaft 212 is elongate, linear, and can have a circular cross section. In some embodiments, the shaft 212 has a rectangular cross-section or cross-section of another shape, such as rhomboid. The coupling end 216 is the end of the shaft 212 opposite the head 214, and the coupling end may be configured for coupling with other components. According to some embodiments, the coupling end 216 is threaded for receiving a screw coupling, has notches to receive click-fit coupling, or can have other coupling mechanisms known in the art.

The lift pin assembly 200 further includes one or more guides to assist in maintaining smooth axial movement of the shaft 212. For example, in some embodiments, the lift pin assembly includes an upper guide 220 and a lower guide 280, arranged axially, in sequence. In some embodiments, the guides 220, 280 are rigidly affixed in the substrate support 100. In some embodiments, the lower guide 280 is coupled to an end holder 250, which can be coupled to the third plate 140. In some embodiments, o-rings 232 are provided on a top surface of the lower guide 280 for improved electrical insulation. In some embodiments, the lower guide 280 is made from ceramic based insulator materials or polymer based insulator materials (e.g., polytetrafluoroethylene (PTFE)). In some embodiments, the upper guide 220 and the lower guide 280 have a different configuration in relation to the electrostatic chuck 110 and the plates 120, 130, 140, or 170, and the substrate support 100 may include additional plates or fewer plates than those shown in FIG. 1.

The upper guide 220 has a top end 221 positioned in the substrate support, such as in the electrostatic chuck 110, for example, below the ledge 118. The top end 221 interfaces with a corresponding shaped ledge 119 in the electrostatic chuck 110, and the ledge 119 which constrains an upward motion of the top end 221 of the upper guide 220. The upper guide 220 includes an opening 211 to facilitate an axial movement of the shaft 212 therethrough. A bottom end 223 of the upper guide can extend to a region in the second plate 130. In some embodiments, the upper guide 220 is made from ceramic based insulator materials or polymer based insulator materials (e.g., polyphenylene sulfide (PPS)).

The lower guide 280 includes an opening 233 at the top to accommodate at least a portion of the upper guide 220, an opening 230 for facilitating an axial movement of the shaft 212, and an opening 240 for accommodating the shaft 212 emerging from the lower guide 280. The opening 240 has a larger cross section than the opening 230 to accommodate other components in addition to the shaft 212, as discussed further below. The lower guide 280 includes a ledge 234 at a base of the opening 233, which engages with the bottom end 223 of the upper guide 220, preventing a movement of the upper guide 220 in a downward direction past the ledge 234. The ledge 234 comprises an opening 236 through which the shaft 212 emerges into the opening 230. The lower guide 280 further includes a shoulder 281 and a second shoulder 282 on an external surface thereof, interfacing with correspondingly shaped ledges 131, 132, respectively formed in the plate 130. The ledges 131, 132 constrain the movement of the lower guide 280 in an upward direction. In some embodiments, the ledges 131, 132 are configured to allow motion only to enable sealing of a top surface of the lower guide 280 by the o-rings 232, without damaging the o-rings 232. In some embodiments, the lower guide 280 is made from ceramic based insulator materials or polymer based insulator materials (e.g., polytetrafluoroethylene (PTFE)). The opening 240 has a top end 242 including an opening 243 through which the shaft 212 emerges from the opening 230 into the opening 240. The opening 240 has a bottom end 244, which extends further downward in the third plate 140. When fully retracted, the lift pin 210 emerges through the opening 240 into a cavity 150 in the third plate 140.

The lift pin assembly 200 further includes a biasing mechanism coupled to the lift pin 210. The biasing mechanism biases the lift pin 210 axially downward, such that the head 214 is biased towards the electrostatic chuck 110. In some embodiments, the biasing mechanism uses springs, additional weights, or magnets to bias the lift pin 210 axially downward. FIG. 1 shows a biasing mechanism including a gripper 260 coupled to the coupling end 216 of the lift pin 210 and extending axially downward therefrom. A top end 261 of the gripper 260 is coupled to the coupling end 216 of the lift pin 210 via known means, including, but not limited to, compression fit, screw fit, click fit, adhesive bonding, among others. The gripper 260 comprises a flange 262 extending horizontally outward from a bottom end of the gripper 260. At least a part of the gripper 260 is disposed in the cavity 150 and a part of the gripper 260 is disposed in a cavity 172 in the base plate 170.

One or more springs 270 are disposed around the shaft 212, between the top end 242 of the lower guide 280 and top end 261 of the gripper 260. When multiple springs 270 are present, spring couplers 272 are disposed around the shaft 212, and between contiguous springs 270. The spring(s) 270 are compressible along an axial direction, along the shaft 212. For example, an upward movement of the gripper 260 would engage the springs 270 between the top end 261 of the gripper 260 and the top end 242 of the opening 240, and cause compression of the springs 270, biasing the gripper 260, and the lift pin 210 affixed thereto in an axially downward direction. Such biasing of the lift pin 210 results in the head 214 being biased toward the electrostatic chuck 110. In some embodiments, the springs 270 comprise polyetherimide, such as ULTEM®.

In some embodiments, a hoop 160 (also referred to herein as a "lift plate") is positioned in the cavity 172, directly below the gripper 260. The hoop 160 is driven by an actuator 173 which provides a force to the gripper 260 to move the gripper 260 in an axially upward direction. In a retracted pin configuration, the hoop 160 is positioned at a gap 264 (about 0.07 inch) from the flange 262, and the springs 270 bias the lift pin 210 axially downward, such that the head 214 is biased toward and engaged with the electrostatic chuck 110. In a lifted pin configuration, the hoop 160 moves upward to drive the gripper 260 such that an upper engagement surface 263 of the flange 262 is in contact with an engagement surface 252 at the bottom of the end holder 250. The engagement surface 252 functions as a rigid stop for the flange 262 of the gripper 260. In a lifted pin configuration, the springs 270 are compressed, and the top end 261 of the gripper 260 moves proximate to the top end 242 of the opening 240. The lift pin 210, coupled to the gripper 260, moves upward such that the head 214 is lifted above the electrostatic chuck 110. In some embodiments, the hoop 160 is driven by an actuator 173 (e.g., electric motor or pneumatic), which may be located beneath the base plate 170 and coupled to the hoop 160. In some embodiments, the electric motor 173 may be a stepper motor, which may have encoder feedback for more precise position control. In some embodiments, the gripper 260 and the couplers 272 are made from polyether ether ketone (PEEK), and the springs 270 are made from a polyetherimide material that can operate in high service temperature environments, such as for example, ULTEM® available from Curbell Plastics, Inc. of New York. In some embodiments, the lift pin is made from aluminum oxide ($Al_2O_3$).

Figure 2:
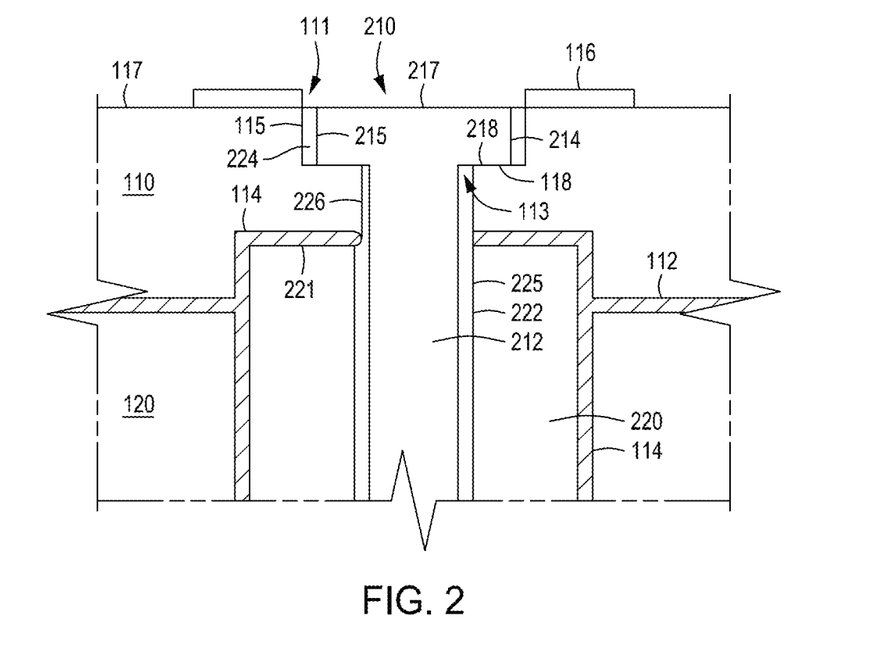
FIG. 2 is a cross section view of a portion of the lift pin assembly of FIG. 1 in accordance with at least some embodiments of the present disclosure.

FIG. 2 shows a top portion of the lift pin assembly 200 in greater detail. The head 214 has a nailhead or a "T" shape, having a flat, horizontal top surface 217, a vertical sidewall 215 extending downward from the edge of the top surface 217, and a base 218 extending from the shaft 212 horizontally outward and terminating at the sidewall 215. The lift pin 210 is configured to be disposed in a lift pin hole 111 in the substrate support 100. The lift pin hole 111 includes an opening 113 in an axial direction in the electrostatic chuck 110, a ledge 118 extending horizontally outward from the opening 113, and a sidewall 115 extending vertically upward from the ledge 118 toward a top surface 117 of the electrostatic chuck 110. The ledge 118 complies with the shape of the base 218 of the lift pin 210. The opening 113 has a diameter larger than that of the shaft 212 by a gap 226, but smaller than the diameter of the head 214 (or the sidewall 215). In some embodiments, the diameter of the head 214 is about 0.16 inch. In some embodiments, the gap 226 is about 0.002 inch.

The diameter of the sidewall 115 of the lift pin hole 111 is larger than the diameter of the head 214, to accommodate the head 214 therein with a gap 224. In some embodiments, the gap 224 is about 0.003 inch. When the lift pin 210 is inserted in the lift pin hole 111, the base 218 of the head 214 rests on the ledge 118. The height of the sidewall 215 of the head 214 is equal to or lower than the height of the sidewall 115 of the lift pin hole 111, such that when the lift pin 210 is fully retracted in the lift pin hole 111, the top surface 217 of the head 214 is flush with or recessed from (e.g., within 0.001 inch to 0.010 inch) a top surface 117 of the electrostatic chuck 110. In some embodiments, the base 218, or the ledge 118, or both have a highly smooth or polished surface to enable close contact between the base 218 and the ledge 118. In some embodiments, the base 218 and/or the ledge 118 has a surface finish/roughness, Ra, between about 4 microinches to about 64 microinches. A close contact between the base 218 and the ledge 118 is realized by biasing the base 218 to press on the ledge 118, for example, by biasing the lift pin 210 axially downward via the springs 270 as discussed above. The close contact between the base 218 and the ledge 118 blocks line of sight and reduces or prevents lift pin arcing. In some embodiments, the horizontal length of the base 218 is about 0.028 inch.

The upper guide 220 provides an opening 225 for the shaft 212 maintaining a gap 222 with the shaft 212. In some embodiments, the gap 222 is about 0.005 inch. A filler 114 is provided between the top end 221 and sides of the upper guide 220 and the electrostatic chuck 110, and a filler 112 provided between the electrostatic chuck 110 and the first plate 120. The filler 112 provides further insulation against leakage, further reducing or preventing lift pin arcing. In some embodiments, the filler 112 and the filler 114 is a potting material, such as silicone.

In some embodiments, a seal band 116 is provided on the top surface 117 of the electrostatic chuck 110, providing a seal with a substrate placed on the electrostatic chuck 110. The seal band 116 also serves to reduce or prevent arcing via the lift pin 210. In some embodiments, the seal band 116 has a band thickness between about 0.02 inch to about 0.060 inch, and a height of about 0.0005 inch.

Figure 3:
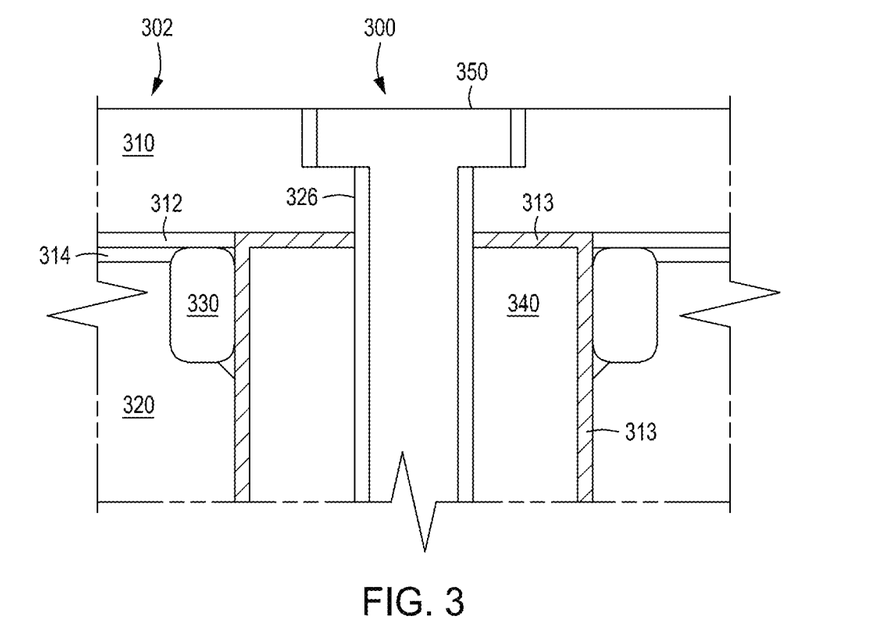
FIG. 3 is a cross section view of a portion of a lift pin assembly in accordance with at least some embodiments of the present disclosure.

FIG. 3 is a cross section view of a portion of a lift pin assembly 300 in accordance with at least some embodiments of the present disclosure. The lift pin assembly 300 comprises a lift pin 350, and the lift pin assembly 300 is identical to the lift pin assembly 200, but is disposed in a different type of a substrate support 302. The substrate support 302 comprises an electrostatic chuck 310 and a first plate 320, which, in operation is RF hot. A silicone bond layer 312 is disposed directly underneath the electrostatic chuck 310, and an aluminum oxide spray coat 314 is disposed underneath the silicone bond layer 312. The first plate 320 is disposed underneath the aluminum oxide spray coat 314. An upper guide 340, similar to the upper guide 220, is disposed in the first plate 320. A doughnut 330 is disposed proximal to the top of the upper guide 340, in the first plate 320. The doughnut 330 is made from aluminum nitride or other ceramic material. A filler 313 is disposed between a top surface of the upper guide 340 and the electrostatic chuck 310, between a side surface of the upper guide 340 and the doughnut 330, and between the side surface of the upper guide 340 and the first plate 320. The filler 313 and the doughnut 330 serve to provide additional insulation from lift pin arcing.

Figure 4:
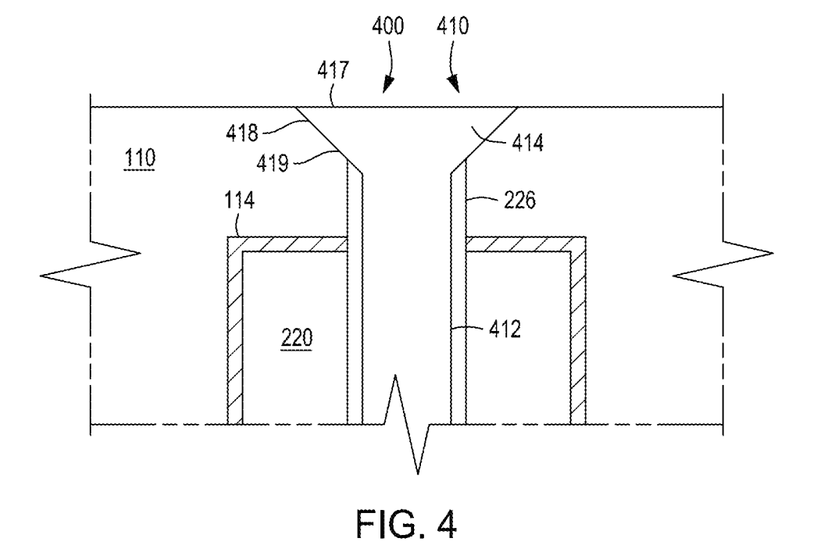
FIG. 4 is a cross section view of a portion of a lift pin assembly in accordance with at least some embodiments of the present disclosure.

FIG. 4 is a cross section view of a portion of a lift pin assembly 400 in accordance with at least some embodiments of the present disclosure. The lift pin assembly 400 comprises a lift pin 410 disposed in a substrate support similar to the substrate support of FIGS. 1 and 2, except that the shape of a head 414 of the lift pin 410 is in a "Y" shape. The head 414 comprises a top surface 417, and a base 418 extending downward from the edge of the top surface 417, inward toward a shaft 412 of the lift pin 410, in a tapered fashion. A tapered ledge 419 of the electrostatic chuck 110 is correspondingly tapered to comply with the base 418 of the head 414, to enable close contact between the head 414 of the lift pin 410 and the tapered ledge 419 of the electrostatic chuck 110. In some embodiments, the base 418 and/or the tapered ledge 419 has a surface finish, Ra, between about 4 microinches to about 64 microinches. A close contact between the base 418 and the tapered ledge 419 is realized by biasing the base 418 to press on the tapered ledge 419, for example, by biasing the lift pin 410 axially downward, in a manner similar to the biasing of the lift pin 210 explained with respect to FIG. 1.

Figure 5A:
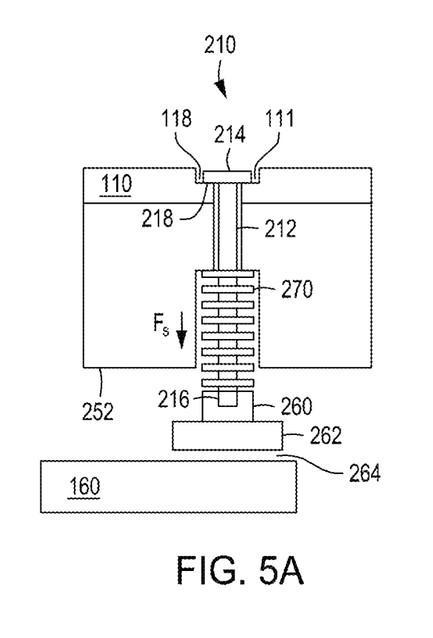
FIGS. 5A and 5B are a schematic representation of the operation of the lift pin assembly of FIG. 1 in accordance with at least some embodiments of the present disclosure.
Figure 5B:
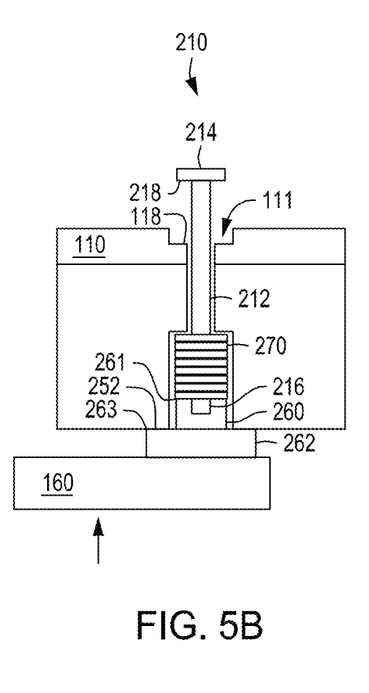

FIGS. 5A and 5B are a schematic representation of the operation of the lift pin assembly 200 of FIG. 1 in accordance with at least some embodiments of the present disclosure. FIG. 5A depicts a retracted configuration of the lift pin 210, in which the lift pin 210 is fully inserted in the lift pin hole 111 of the electrostatic chuck 110, such that the base 218 of the head 214 rests on the ledge 118. The springs 270 are installed in a pre-loaded configuration to apply a biasing downward force Fs on the lift pin 210 via the coupling with the gripper 260. The force acting on the gripper is about 0.34 lbf. The hoop 160 actuator is positioned below the flange 262 of the gripper 260, spaced apart from the gripper 260 by the gap 264.

FIG. 5B depicts a lifted configuration of the lift pin 210, in which a portion of the lit pin 210 has emerged out from the electrostatic chuck 110. To achieve the lifted configuration shown in FIG. 5B, the hoop 160 moves upward in the direction shown by the arrow, pushing the flange 262 of the gripper 260 upward. The flange 262 comes to a stop when the upper engagement surface 263 of the flange 262 contacts the engagement surface 252 of the end holder 250. In the lifted configuration, the top end 261 of the gripper 260 moves inside the opening 240 and the springs 270 are compressed, and exert a force of about 1.63 lbf, which force is countered by the hoop 160 such that the springs 270 do not exert any net biasing force on the lift pin 210. The force exerted by the hoop 160 pushes the lift pin 210 up such that the lift pin raises to a height of about 0.84 inch above the electrostatic chuck 110. In operation, the lift pin 210, or multiple such lift pins disposed in the substrate support assembly 100 are lifted by the common hoop 160, and are operable to lift a substrate disposed on the electrostatic chuck 110.

Figure 6:
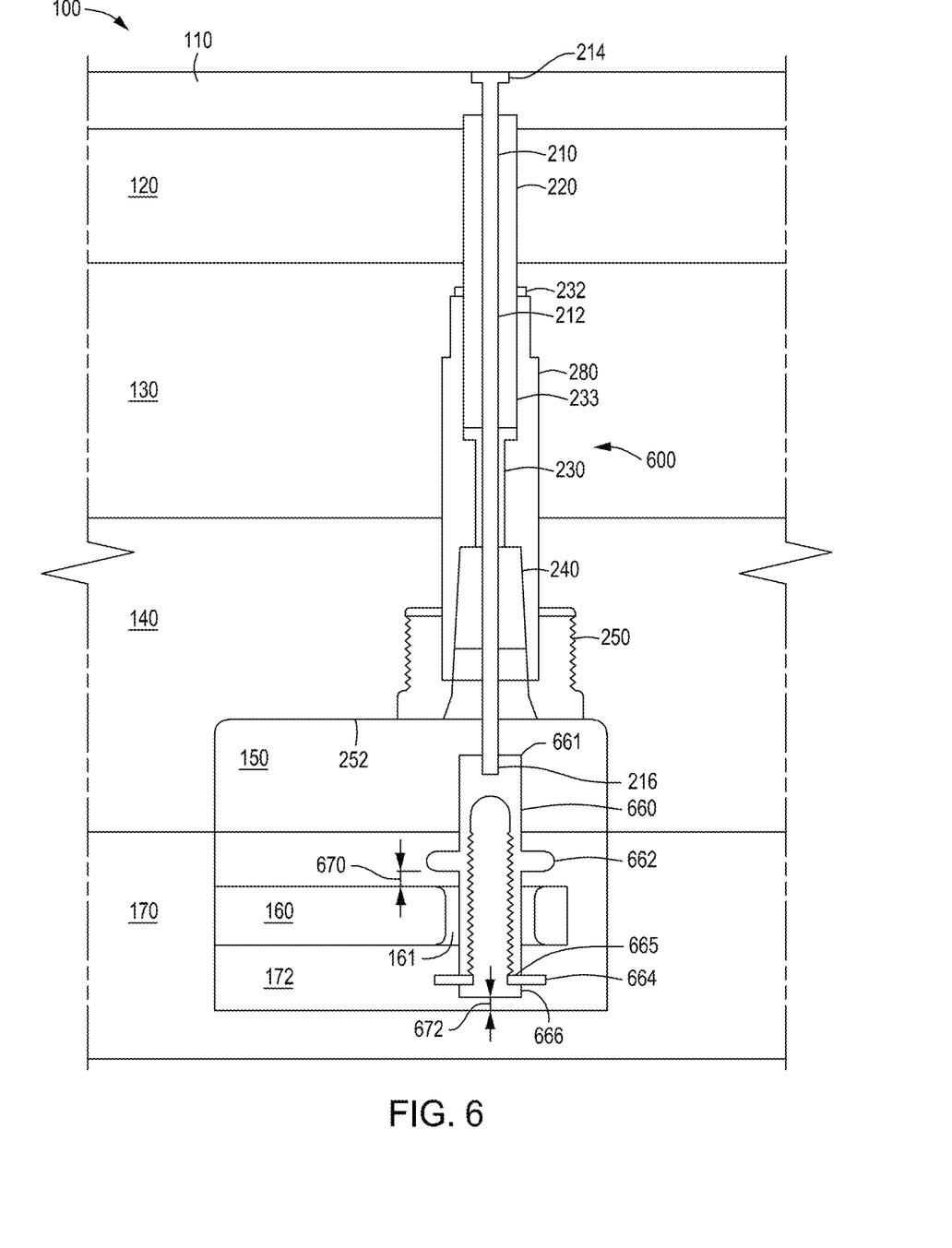
FIG. 6 is a cross section view of a substrate support including a lift pin assembly, in accordance with at least some embodiments of the present disclosure.

FIG. 6 is a cross section view of the substrate support 100 including a lift pin assembly 600, in accordance with at least some embodiments of the present disclosure. The lift pin assembly 600 is similar to the lift pin assembly 200, however, the lift pin assembly 600 uses the biasing mechanism based on weight instead of springs (for example, springs 270 of FIG. 1). A gripper 660 is coupled to the coupling end 216 of the lift pin 210. In a retracted configuration of the lift pin 210, the gripper 660 is disposed partially in the cavity 150 of the third plate 140 and partially in the cavity 172 of the base plate 170. In some embodiments, the gripper 660 passes through an opening 161 in the hoop 160. The gripper 660 includes a flange 662 positioned above the hoop 160, and the gripper 660 includes additional weight secured to the gripper 660. In some embodiments, the additional weight is a bolt 666 screwed axially to a bottom end 665 of the gripper 660. In some embodiments, the gripper 660 further comprises a washer 664 disposed between a head of the bolt 666 and the bottom end 665 of the gripper 660. In the retracted lift pin configuration, the flange 662 is positioned at a gap 670 from the hoop 160, and the bolt 666 is positioned at a gap 672 from a base of the cavity 172. The weight of the bolt 666 along with the weight of the gripper 660 and the lift pin 210 is sufficient to bias the lift pin 210 axially downward, for example, during operation of the substrate assembly 100. In some embodiments, the downward biasing force enabled by gravity on the lift pin 210 and the gripper 660 including the bolt 666 is about 0.022 lbf. In some embodiments, the bolt 666 is made from aluminum oxide ($Al_2O_3$), the washer 664 and the gripper 660 are made from polyether ether ketone (PEEK). In some embodiments, the washer 664 has a diameter larger than that of the opening 161, in some embodiments, the washer 664 has a diameter smaller than that of the opening 161, and in some embodiments, no washer is used, and the bolt 666 is coupled directly to the gripper 660 without an intermediate washer, for example, the washer 664.

Figure 7A:
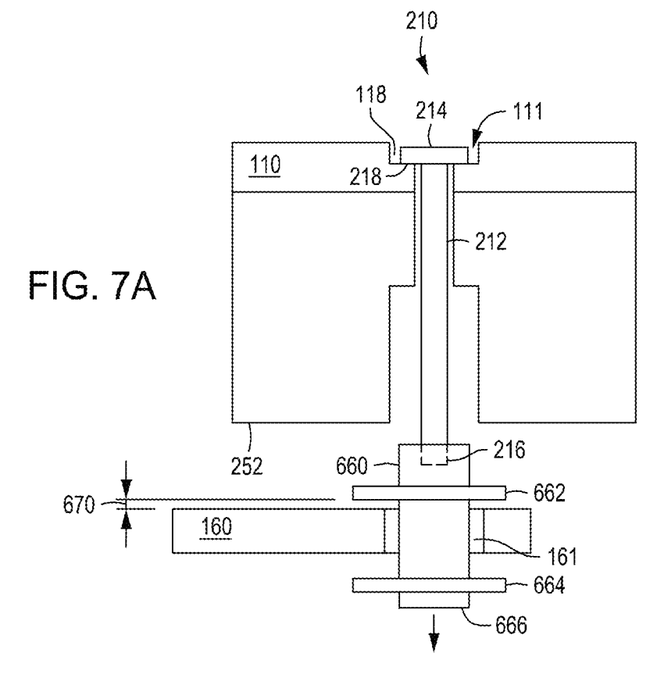
FIGS. 7A and 7B are a schematic representation of the operation of the lift pin assembly of FIG. 6 in accordance with at least some embodiments of the present disclosure.
Figure 7B:
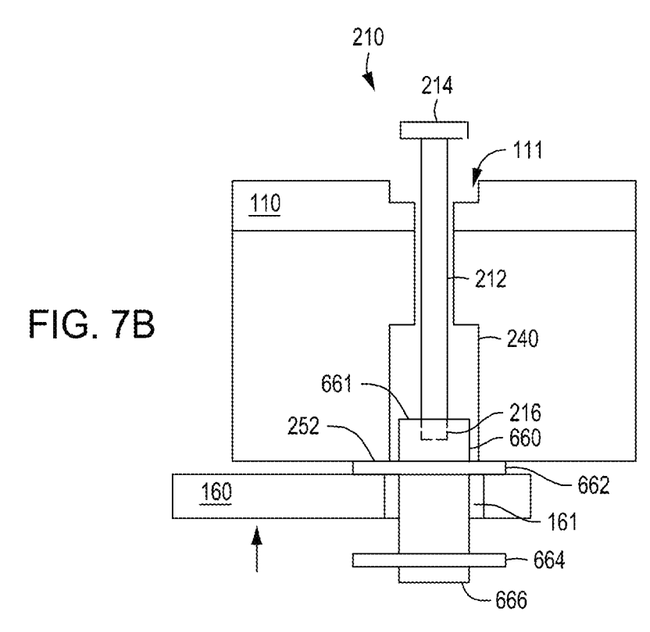

FIGS. 7A and 7B are a schematic representation of the operation of the lift pin assembly 600 of FIG. 6 in accordance with at least some embodiments of the present disclosure. FIG. 7A depicts a retracted configuration of the lift pin 210, in which the lift pin 210 is fully inserted in the lift pin hole 111 of the electrostatic chuck 110, such that the base 218 of the head 214 rests on the ledge 118. The weight of the lift pin 210 and the gripper 660 with the bolt 666 applies a biasing downward force on the lift pin 210 via the coupling with the gripper 660. The hoop 160 is positioned below the flange 662 of the gripper 660, spaced apart from the gripper 660 by the gap 670. Part of the gripper 660 may extend through the opening 161 in the hoop 160 in the retracted position.

FIG. 7B depicts a lifted configuration of the lift pin 210, in which a portion of the lit pin 210 has emerged out from the electrostatic chuck 110. To achieve the lifted configuration shown in FIG. 7B, the hoop 160 moves upward in the direction shown by the arrow, pushing the flange 662 of the gripper 660 upward. The flange 662 comes to a stop when the flange 662 contacts the engagement surface 252 of the end holder 660. In the lifted configuration, the top end 661 of the gripper 660 moves inside the opening 240, and the weight of the lift pin 210 and the gripper 660 with the bolt 666 is supported by the hoop 160. The force exerted by the hoop 160 pushes the lift pin 210 up such that the lift pin raises to a height of about 0.84 inch above the electrostatic chuck 110. In operation, the lift pin 210, or multiple such lift pins disposed in the substrate support assembly 100 are lifted by the common hoop 160, and are operable to lift a substrate disposed on the electrostatic chuck 110.

Figure 8A:
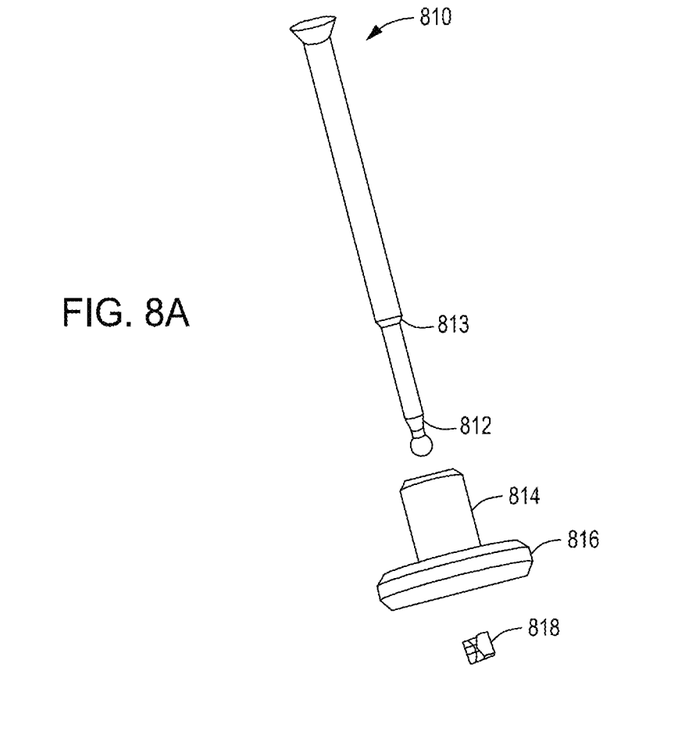
FIGS. 8A and 8B each depict a weighted lift pin, in accordance with at least some embodiments of the present disclosure.
Figure 8B:
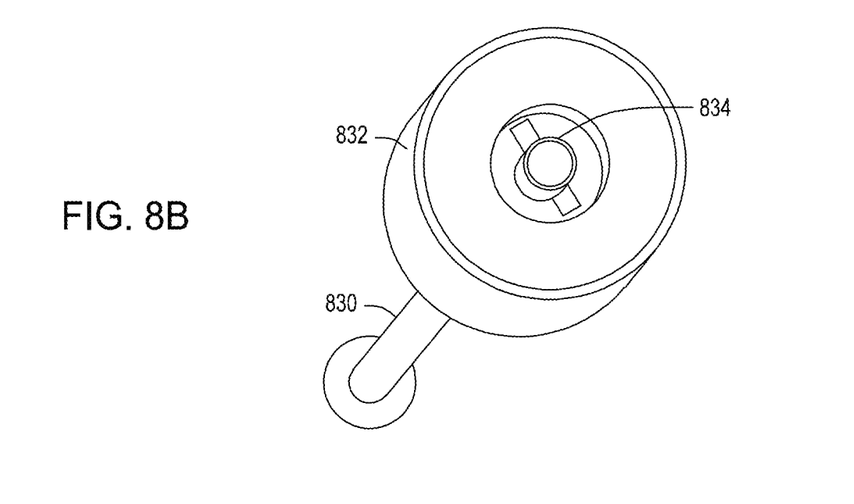

While FIGS. 6, 7A, and 7B depict a gripper 660 and a bolt 666 to provide a biasing weight, several other configurations of a biasing weight are possible, for example, as shown in FIGS. 8A and 8B. For example, FIG. 8A depicts a lift pin 810 having a detent design for suspending a weight to bias the lift pin 810. The lift pin 810 comprises a detent receiver 812, and a ledge 813 to push against when raising the lift pin 810. Further, a gripper 814 comprises an opening therethrough, and along with the weight of the lift pin 810, provides the additional weight required for biasing the lift pin 810 in an axially downward direction. The gripper 814 includes a flange 816 extending radially outward from the gripper 814. The lift pin 810 passes through the opening of the gripper 814 and locks with the gripper 814 via a detent lock 818 configured to mate with the detent receiver 812. In operation, the gripper 814 is suspended from the lift pin 810, and the flange 816 serves to engage with the hoop 160 to move the gripper 814, and the detent-coupled lift pin 810 in an axially upward direction.

FIG. 8B depicts a lift pin 830 coupled with a disc 832 via a locking pin 834. The disc 832, in addition to the lift pin 830, provides the additional weight required for biasing the lift pin 830. In some embodiments, the disc 832 and the lift pin 830 weigh about 0.014 lb. The disc 832 has the width to engage with the hoop 160, such that an upward movement of the hoop 160 would engage the disc 832 and the lift pin 830 coupled to the disc 832, moving the lift pin 830 in an axially upward direction.

Various components of the lift pin mechanisms disclosed herein may also comprise materials such as polyether ether ketone (PEEK), polytetrafluoroethylene (PTFE), polyphenylene sulfide (PPS) and Vespel® Polyimide.

Thus, embodiments of lift pin assemblies for electrostatic chucks have been provided herein. Embodiments of the present disclosure advantageously reduce or eliminate lift pin arcing in high voltage applications of the electrostatic chuck.

While the foregoing is directed to embodiments of the present disclosure, other and further embodiments of the disclosure may be devised without departing from the basic scope thereof.

The invention claimed is:

1. A lift pin assembly, comprising:
a lift pin comprising an elongate shaft, a head at a top of the elongate shaft, and a coupling end at a bottom of the elongate shaft, the head configured to rest against an electrostatic chuck;
an upper guide comprising a top end, a bottom end, and a first opening extending from the top end to the bottom end, wherein the elongate shaft is disposed through and axially movable through the first opening;
a lower guide comprising a top end, a bottom end, a second opening and a third opening extending from the top end to the bottom end, wherein the third opening is larger than the second opening, and wherein the elongate shaft is disposed through and can freely axially move through the second opening and the third opening; and
a biasing mechanism coupled to the elongate shaft and configured to bias the lift pin against the electrostatic chuck in a downward direction from the head of the lift pin to the coupling end of the lift pin.

2. The lift pin assembly of claim 1, wherein the biasing mechanism comprises:
a gripper comprising a top end and a bottom end, wherein the gripper is coupled to the coupling end of the lift pin at the top end of the gripper, and the bottom end of the gripper comprises a flange; and
a spring positioned about the elongate shaft in the third opening of the lower guide, wherein a top end of the spring faces a top end of the lower guide, and a bottom end of the spring faces the top end of the gripper, wherein the spring is configured to bias the gripper in the downward direction.

3. The lift pin assembly of claim 2, wherein moving the gripper in an upward direction causes the spring to bias the lift pin in the downward direction.

4. The lift pin assembly of claim 1, wherein the biasing mechanism comprises:
a gripper comprising a top end and a bottom end, wherein the gripper is coupled to the coupling end of the lift pin at the top end of the gripper, and the gripper comprises:
a flange extending from the gripper between the top end and the bottom end, and
a bolt coupled to the gripper at the bottom end, wherein the bolt is configured to include additional weight to bias the lift pin in the downward direction.

5. The lift pin assembly of claim 4, wherein the gripper further comprises a washer disposed between the bolt and the bottom end.

6. The lift pin assembly of claim 1, wherein the lift pin is configured to be inserted in a lift pin hole formed in the electrostatic chuck, the lift pin hole comprising:
an opening for the elongate shaft of the lift pin, and
a ledge extending outward and optionally upward from the opening of the elongate shaft,
wherein a base of the head is shaped to make close contact with the ledge when the lift pin is in a retracted position, and
wherein the top of the head is flush with or recessed from a top surface of the electrostatic chuck when the lift pin is in the retracted position.

7. The lift pin assembly of claim 6, wherein the base of the head has a Ra roughness between 4 and 64 microinches.

8. The lift pin assembly of claim 6, wherein the head extends horizontally outward from the elongate shaft, the head and the elongate shaft forming a "T" shape.

9. The lift pin assembly of claim 6, wherein the lift pin hole comprises a sidewall extending vertically upward from the ledge to an upper surface of the electrostatic chuck.

10. The lift pin assembly of claim 6, wherein the head extends horizontally outward and upward from the elongate shaft, the head and the elongate shaft forming a "Y" shape.

11. The lift pin assembly of claim 6, wherein the lift pin hole comprises a tapered sidewall extending vertically upward and outward from the ledge to an upper surface of the electrostatic chuck.

12. A substrate support, comprising:
an electrostatic chuck having a surface configured to support a substrate and having a plurality of lift pin holes;
a base plate beneath the electrostatic chuck; and
a plurality of lift pin assemblies disposed within the base plate, and configured to allow a corresponding plurality of lift pins to pass through corresponding lift pin holes of the electrostatic chuck, each of the plurality of lift pin assemblies comprising
a lift pin comprising an elongate shaft, a head at a top of the elongate shaft, and a coupling end at a bottom of the elongate shaft, the head configured to rest against the electrostatic chuck;
an upper guide comprising a top end, a bottom end, and a first opening extending from the top end to the bottom end, wherein the elongate shaft is disposed through and axially movable through the first opening;
a lower guide comprising a top end, a bottom end, a second opening and a third opening extending from the top end to the bottom end, wherein the third opening is larger than the second opening, and wherein the elongate shaft is disposed through and can freely axially move through the second opening and the third opening; and a biasing mechanism coupled to the elongate shaft and configured to apply a biasing force to bias the lift pin against the electrostatic chuck in a downward direction from the head of the lift pin to the coupling end of the lift pin; and a lift plate disposed within the base plate and configured to selectively provide a force against a bottom of the lift pins sufficient to overcome the biasing force and raise the heads of the lift pins above the surface of the electrostatic chuck.

13. The substrate support of claim 12, wherein the biasing mechanism comprises:

a gripper comprising a top end and a bottom end, wherein the gripper is coupled to the coupling end of the lift pin at the top end of the gripper, and the bottom end of the gripper comprises a flange; and a spring positioned about the elongate shaft in the third opening of the lower guide, wherein a top end of the spring faces a top end of the lower guide, and a bottom end of the spring faces the top end of the gripper, wherein the spring is configured to bias the gripper in the downward direction.

14. The substrate support of claim 13, wherein moving the gripper in an upward direction causes the spring to bias the lift pin in the downward direction.

15. The substrate support of claim 12, wherein the biasing mechanism comprises:

a gripper comprising a top end and a bottom end, wherein the gripper is coupled to the coupling end of the lift pin at the top end of the gripper, and the gripper comprises:

a flange extending from the gripper between the top end and the bottom end, and a bolt coupled to the gripper at the bottom end, wherein the bolt is configured to include additional weight to bias the lift pin in the downward direction.

16. The substrate support of claim 12, wherein each lift pin hole comprises:

an opening for the elongate shaft of a corresponding lift pin, and a ledge extending outward and optionally upward from the opening of the elongate shaft, wherein a base of the head is shaped to make close contact with the ledge when the corresponding lift pin is in a retracted position, and wherein a top of the head is flush with or recessed from a top surface of the electrostatic chuck when the corresponding lift pin is in the retracted position.

17. The substrate support of claim 16, wherein the base of the head has a Ra roughness between 4 and 64 microinches.

18. The substrate support of claim 16, wherein the head extends horizontally outward from the elongate shaft, the head and the elongate shaft forming a "T" shape.

19. The substrate support of claim 16, wherein the head extends horizontally outward and upward from the elongate shaft, the head and the elongate shaft forming a "Y" shape.

20. A substrate support, comprising:

an electrostatic chuck having a surface configured to support a substrate and having a plurality of lift pin holes;

a first plate and a second plate beneath the electrostatic chuck, the first plate configured for coupling to an RF power source;

a base plate beneath the first plate and the second plate;

a plurality of lift pin assemblies disposed within the base plate, the first plate, and the second plate, and configured to allow a corresponding plurality of lift pins to pass through corresponding lift pin holes of the electrostatic chuck, each of the plurality of lift pin assemblies comprising:

a lift pin comprising an elongate shaft, a head at a top of the elongate shaft, and a coupling end at a bottom of the elongate shaft, the head configured to rest against the electrostatic chuck;

an upper guide comprising a top end, a bottom end, and a first opening extending from the top end to the bottom end, wherein the elongate shaft is disposed through and axially movable through the first opening;

a lower guide comprising a top end, a bottom end, a second opening and a third opening extending from the top end to the bottom end, wherein the third opening is larger than the second opening, and wherein the elongate shaft is disposed through and can freely axially move through the second opening and the third opening; and a biasing mechanism coupled to the elongate shaft and configured to apply a biasing force to bias the lift pin against the electrostatic chuck in a downward direction from the head of the lift pin to the coupling end of the lift pin; and a lift plate disposed within the base plate and configured to selectively provide a force against a bottom of the lift pins sufficient to overcome the biasing force and raise the heads of the lift pins above the surface of the electrostatic chuck.

* * * * *